United States Patent [19]

Kamerling et al.

[11] Patent Number: 5,154,810
[45] Date of Patent: Oct. 13, 1992

[54] THIN FILM COATING AND METHOD

[75] Inventors: Marc A. Kamerling; William T. Beauchamp, both of Santa Rosa; Robert E. Klinger, Rohnert Park; John P. Lehan, Calistoga, all of Calif.

[73] Assignee: Optical Coating Laboratory, Inc., Santa Rosa, Calif.

[21] Appl. No.: 647,660

[22] Filed: Jan. 29, 1991

[51] Int. Cl.$^5$ ............... C23C 14/54; H01L 31/18
[52] U.S. Cl. ............... 204/192.13; 136/256; 118/712; 118/719; 118/730; 204/192.26; 204/298.03; 204/298.26; 427/8; 427/126.3; 427/126.4; 437/2
[58] Field of Search ............ 204/192.13, 192.22, 204/192.23, 192.26, 298.03, 298.26; 427/8, 74, 126.3, 126.4; 118/712, 719, 730; 437/2-5; 136/256

[56] References Cited

U.S. PATENT DOCUMENTS 4,320,155  3/1982  Gillery ........................ 427/160
4,851,095  7/1989  Scobey et al. ............... 204/192.12

FOREIGN PATENT DOCUMENTS 0112480  10/1988  European Pat. Off. ......... 136/256
3233022  3/1984   Fed. Rep. of Germany .
3710365  10/1988  Fed. Rep. of Germany ... 118/712
1-172571  7/1989  Japan ............................ 118/713

OTHER PUBLICATIONS

C. D. Adams et al., *Conference Record, 19th IEEE Photovoltaic Specialists Conf.* (1987), pp. 469-474.

Primary Examiner—Aaron Weisstuch
Attorney, Agent, or Firm—Philip A. Dalton

[57] ABSTRACT

A system and process for forming optical quality, protective, relatively thick, thin film coatings on workpieces such as detectors or solar cells. The apparatus includes a rotary cylindrical sputtering system which incorporates separate deposition devices and at least one chemical reaction device for simultaneously (1) depositing materials which form tensile and compressive oxides and (2) oxidizing the deposited materials. The system also includes a stressometer system, preferably a cantilevered beam stressometer system which monitors the stress of the depositing film in-situ. The monitored stress levels are used to control the relative amounts of compressive and tensile materials which are deposited and, thus, control stress in the thin film coatings. In a preferred embodiment for forming protective covers on solar cells, the deposition devices are linear magnetron sputter cathode devices having silicon and aluminum targets, and the reaction device is a linear magnetron ion source oxidizer device. Film stress in the thin film coating is controlled by controlling power to the silicon and aluminum targets.

13 Claims, 3 Drawing Sheets

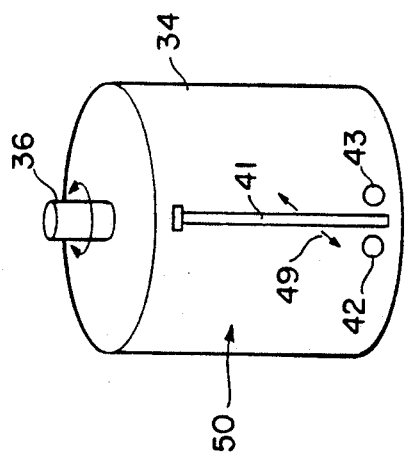
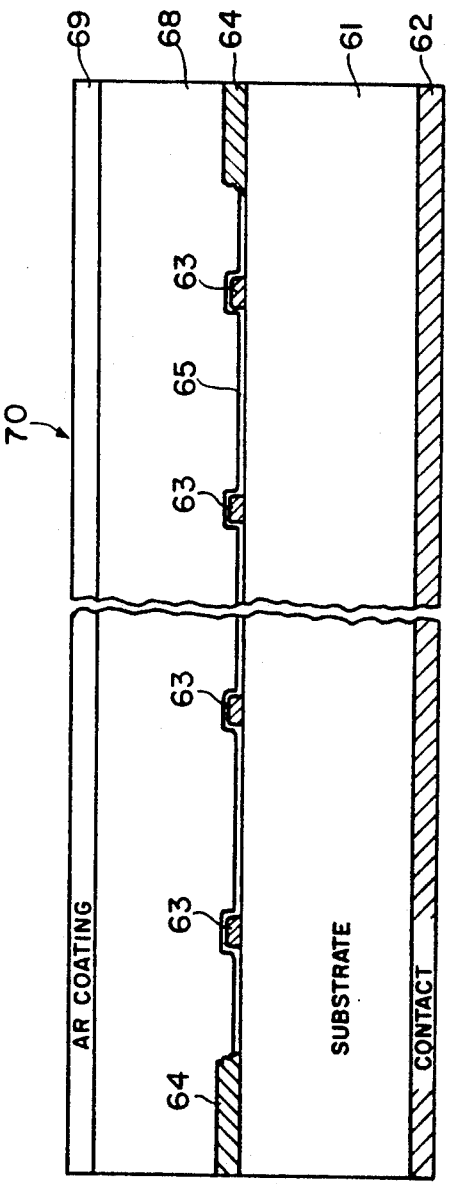

THIN FILM COATING AND METHOD

CROSS-REFERENCE TO RELATED APPLICATION(S)

This application is related to of commonly assigned U.S. patent application Ser. No. 604,362, filed Oct. 26, 1990, which is a continuation of commonly assigned U.S. patent application Ser. No. 490,535, filed Mar. 5, 1990, now abandoned, which is a continuation of commonly assigned U.S. patent application Ser. No. 374,484, filed Jun. 30, 1989, now abandoned, which is a continuation of commonly assigned U.S. Pat. No. 4,851,095, entitled MAGNETRON SPUTTERING APPARATUS AND PROCESS, issued Jul. 25, 1989, to inventors Scobey, Seddon, Seeser, Austin, LeFebvre, and Manley from application Ser. No. 154,177 filed Feb. 8, 1988, which applications and patent are incorporated by reference.

BACKGROUND OF THE INVENTION a. Field of the Invention

The present invention relates to thin film coatings and to physical vapor deposition methods for manufacturing such coatings. More specifically, our invention also relates to protective thin film optical coatings formed on, and/or which include, optical detectors and to methods of manufacturing such coatings. Still more specifically, our invention also relates to solar cells, protective thin film optical coatings for such cells, and to methods of forming such coatings.

As used here in reference to our invention, the term "optical" coating (or cover) means a coating which affects reflection, transmission, absorption or scatter of electromagnetic energy at an interface.

b. Current state of the Relevant Technology (1) Overview of Solar Cell Construction A typical solar cell is depicted schematically in FIG. 1. (The illustrated cell 10 is not drawn to scale; relative dimensions are altered for ease of viewing. Also, various conventional components, such as the electrical connections to associated cells in an array, are omitted for clarity.) The typical cell 10 comprises a substrate 11 of semiconductor material (single crystal silicon, polycrystalline silicon (polysilicon), amorphous silicon, GaAs (gallium arsenide),etc.) having conductors 13 formed on its front surface and associated, surface-adjacent pn junctions (not shown) for converting solar radiation of selected wavelength range into electrical current and power. The electrical current is conducted by a bus bar 14 connected to the front side conductors 13 and by conductor coating 12 formed on the back of the substrate to other cells in the array and ultimately to devices which are operated by the cell(s) and/or to storage batteries. Anti-reflection (AR) coating 15 is formed on the front of the substrate 11. The substrate 11 is covered by a protective glass cover 18, which is attached to the substrate (or, as here, to the AR coating on the front of the substrate) by adhesive layer 16. The AR coating 15 is optically matched to the adhesive layer 16.

Optionally, a so-called "blue", ultra-violet (UV) reflector coating 17 can be formed on the rear surface of cover glass 18, to protect the adhesive from UV radiation. Optional layer(s) 19 formed on the outer front surface of the cover 18 comprise simple AR coatings of material such as magnesium fluoride; UV reflector coatings; conductive coatings for bleeding off static electricity, etc.; or combinations of such coatings.

Typical thickness values for these coatings are: simple AR, a fraction of a micron, e.g., 0.1 micron; blue UV reflector, less than or equal to one micron; and adhesive, 0.002 to 0.003 inch (50 to 75 microns). Suitable cover materials include various amorphous glasses and fused silica. Typical thickness ranges for the glass and the fused silica are about 0.003 in. to about 0.012 in. and about 0.005 in. to about 0.040 in., respectively. The useful thickness range is determined by the requirements that the cover be able to withstand handling (the covers and cells are handled repeatedly during the coating and sizing processes), by emissivity, and by the need for radiation hardness. In particular, the very thick covers are for cells on spacecraft which traverse the Van Allen belt.

(2) Solar Cell Design Considerations

Our consideration here is primarily solar cells used in space applications, that is, those carried on spacecraft such as satellites, shuttles and space stations, with emphasis on the critical cover and adhesive technologies. Such applications require that, first, the cover have excellent integrity, characterized for example by the absence of pinholes that render the cell subject to attack by the environment in space. Second, the cover, adhesive and other components are selected and constructed to be of the lightest possible weight, consistent with the other, often conflicting, stringent requirements for the solar cell. The other requirements include the dual requirements that the cover provide sufficient radiation hardness and have high thermal emissivity. Fifth, the cover must have high optical transmissivity over the radiation wavelength range of interest. Our primary concern here is the short wavelength portion of the solar emissions spectrum from about 280 nm (nanometer) to about 700–1100 nm. High transmissivity over this range ensures that the high energy, short wavelength radiation is available for conversion to electrical energy at the pn junctions and is not wasted in generating heat. Sixth, the cell should not be degraded by the fabrication process, as measured, e.g., by electrical parameters such as open collector voltage, short circuit current, and the fill factor. Two additional, closely related requirements are the ability of the cell to withstand thermal cycling between temperature extremes, as indicated by the standard temperature test cycle of −196° C. to +175° C.; and the requirement that the cover and the substrate have closely matched thermal expansion coefficients, to avoid warpage and breakage during the temperature excursions experienced by the cell.

Typically, the adhesive 16 which is used to mount and seal the glass cover 18 to the substrate 11 is the most critical component affecting cell integrity and thermal durability in that it is the most susceptible to deterioration at high temperatures and by UV radiation. Accordingly, it is desirable to eliminate the use of the adhesive bonded glass cover and, instead, to use a thin film coating as the cover. Unfortunately, in the past, the inability of thin film coatings to satisfy the above-discussed combination of objectives has precluded the use of such coatings as solar cell covers. Specifically, thin film technology has not been successfully used in this application because of the problems of (1) inadequate stress control and excessive stress in the very thick thin films which are required (for example, for adequate radiation hardness thicknesses of at least 10–50 microns may be required); (2) inadequate adhesion to the substrate; (3)

non-uniform films; and (4) lack of scalability. Such relatively thick, thin films are characterized by uncontrolled, unacceptably high stress and associated warpage and breakage. The problem is not limited to space applications; in general, stress effects limit the useful thicknesses of optical thin films.

SUMMARY OF THE INVENTION

In one aspect, our invention which accomplishes the above objectives is embodied in a physical vapor deposition process for forming coatings on a substrate, and comprises simultaneously depositing and oxidizing at least two materials on the substrate to form a thin film coating thereon, with the materials being at least a first material the oxide of which imparts compressive force characteristics to the coating and at least a second material which imparts tensile force characteristics to the coating; monitoring the stress in the coating during formation thereof; and, responsive to the monitored stress, adjusting the relative deposited amount of said materials to control the stress in the coating.

In another aspect, our invention is embodied in a process for forming a coating on a substrate, comprising: providing drum means adapted for mounting substrates thereon; rotating the drum means to rotate the substrate past circumferential work stations; using deposition devices adjacent the circumference of the drum, depositing onto the substrates at least a first material the oxide of which imparts tensile force characteristics to the substrates and at least a second material the oxide of which imparts compressive force characteristics to the substrates; oxidizing the materials as they are deposited; using a cantilever beam stressometer system which includes a cantilevered reflector beam mounted on the drum, monitoring the stress levels of the coating in-situ as it is formed; and responsive to the monitored stress, controlling the relative amounts of the materials deposited on the substrate to control the stress in the coating.

In another, apparatus aspect, our invention is embodied in a system for forming optical coatings on substrates, comprising: means for simultaneously depositing at least two materials on the substrates and oxidizing the materials to form a thin film coating thereon, the means comprising at least a first means for depositing a material which imparts compressive force characteristics to the coating and at least a second means for depositing a material which imparts tensile force characteristics to the coating; means for monitoring the stress level in the coating during formation thereof; and means responsive to the monitored stress level for controlling the operation of the deposition means to thereby control the relative deposited amounts of said materials and control the stress in the coating. In more specific aspects, the system includes a drum means adapted for mounting substrates thereon and for rotating the substrates past circumferential work stations and at least a pair of deposition devices positioned adjacent the circumference of the drum. One of the deposition devices is adapted for depositing on the substrate a material which imparts tensile force characteristics to the coating. A second of the devices is adapted for simultaneously depositing on the substrate a material imparting compressive force characteristics to the coating. Cantilever beam stressometer means is incorporated into the system, and includes a cantilever reflector beam mounted on the drum for monitoring the stress of the depositing film in-situ as it is formed.

The coatings can be protective covers or coatings, optical coatings or covers, and protective optical coatings or covers. In presently preferred apparatus and processes for forming a protective optical cover on detectors or solar cells, the materials are silicon and aluminum.

BRIEF DESCRIPTION OF THE DRAWING

The above and other aspects of the invention are described with respect to the drawing, in which:

FIG. 5 is a partial perspective view of the system of FIG. 3 illustrating the mounting of the cantilever beam on the drum; and FIG. 6 is a cross-section of an integral covered solar cell embodying the present invention.

DETAILED DESCRIPTION OF THE PREFERRED EMBODIMENT(S)

a. Overview

As discussed above, our invention relates to the formation of and use of thin film coatings as protective optical covers for substrates such as solar cells and detectors. The protective optical covers are formed from two or more optically compatible constituents, such as silicon and aluminum, which impart different stress characteristics and are thermally and optically compatible with the solar cell. During deposition, the stress of the depositing thin film coating is monitored in situ and the composition of the depositing film is responsively adjusted in real time to provide the desired stress characteristics. In one exemplary embodiment in which a thin film coating is deposited as a protective optical cover for a substrate such as a solar cell or optical detector, the composition is adjusted to provide approximately zero net stress across the thickness of the film. That is, the film is neither compressive nor tensile. As is readily obvious, using our approach the stress could also be maintained at a constant compressive or tensile value or varied as desired across the film thickness.

Our apparatus and process are modifications of the apparatus and process disclosed in the referenced, incorporated '095 patent, and uniquely satisfy the above-discussed, numerous conflicting requirements of solar cell covers and eliminate the problems associated with using thin film coatings as solar cell covers, namely, those of stress control, adhesion, uniformity and scalability.

b. Preferred Vacuum Deposition System

Figure 1:
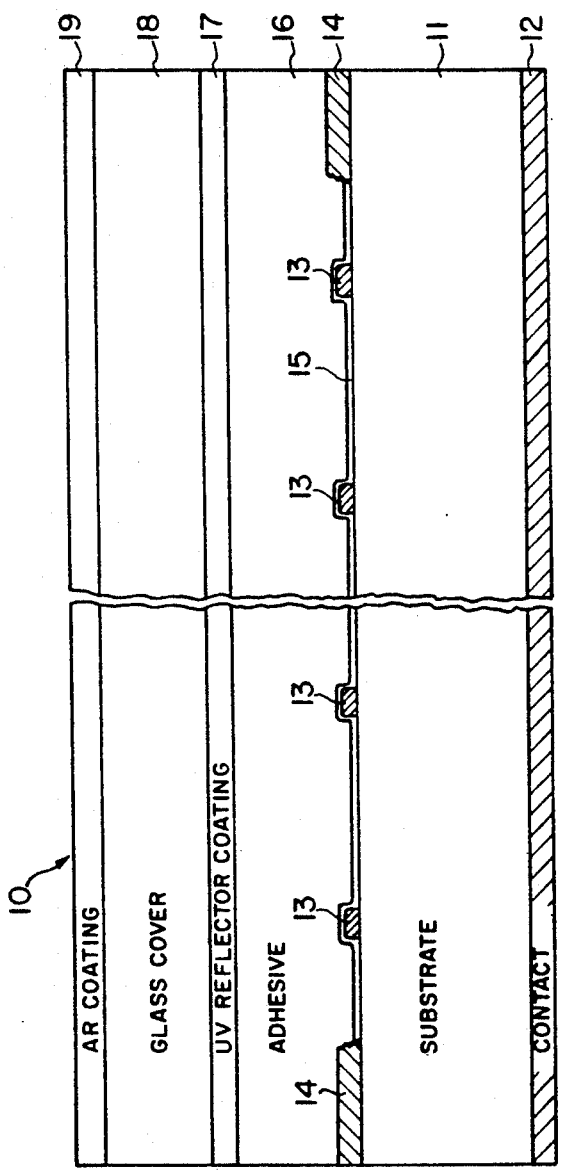
FIGS. 1 and 2 are a cross-section view and a top plan view of a prior art glass covered solar cell.
Figure 2:
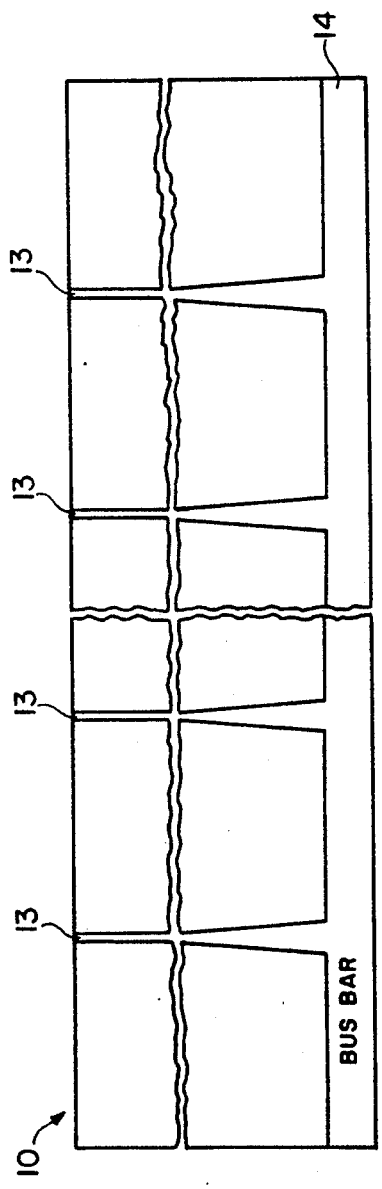
Figure 3:
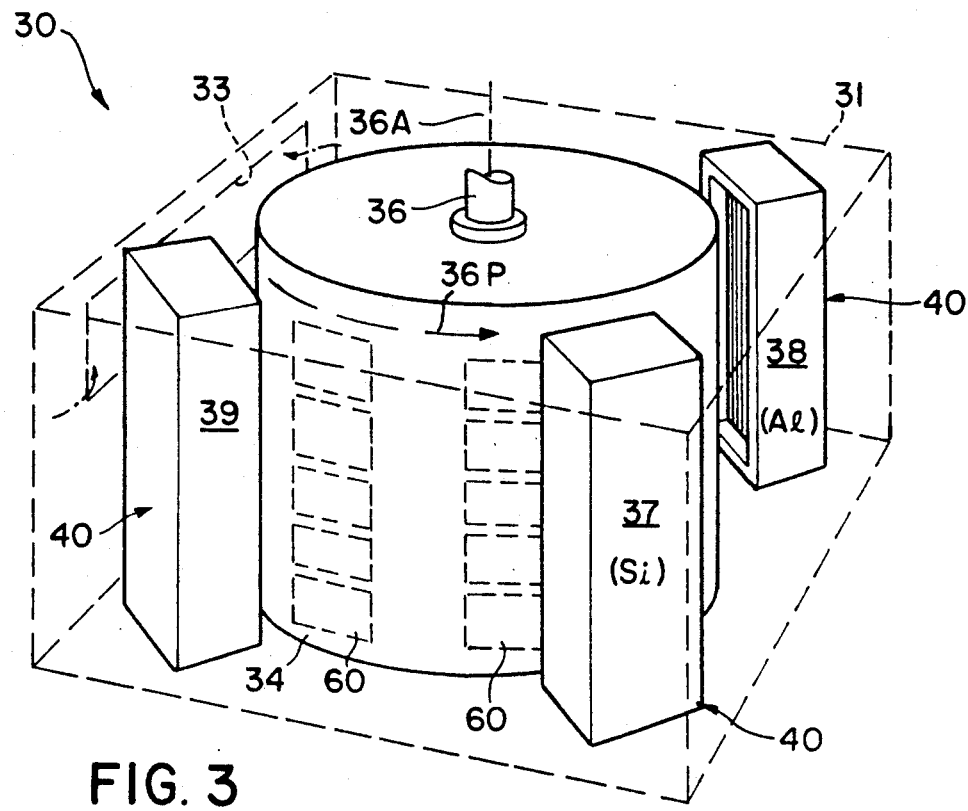
FIGS. 3 is a simplified schematic perspective view of a preferred embodiment of our vapor deposition system.

FIG. 3 depicts a vacuum processing chamber system 30 for practicing our invention. The system is a modification of the system disclosed in the referenced, incorporated '095 patent. The illustrated system 30 comprises an enclosure 31 defined by appropriate walls, ceiling and floor which forms a vacuum processing chamber (both the enclosure and the vacuum processing chamber are designated 31). The enclosure rotatably mounts a drum 34 therein which is rotated by drive shaft 36 along path 36P for transporting substrates 60 mounted on the external periphery of the drum past circumferential work stations 40. Specifically, the substrates are transported through processing zones at selected one(s) of the work stations 40. These include circumferential deposition zones provided by deposition devices 37 and 38 (for example, linear magnetron sputter devices of the type described in the incorporated '095 patent), and one or more circumferential reaction zones provided by reaction devices 39 such as an oxidizing device (for example, an inverse linear magnetron ion source device of the type described in the incorporated '095 patent). The system 30 also includes hardware such as a suitable vacuum pumping system 32, FIG. 4. The vacuum system includes a cyropump (or other suitable vacuum pump or combinations of pumps), which communicates into the chamber 31 via port 33 for exhausting and pumping down the chamber. This and other standard hardware will be readily supplied by those of usual skill in the art.

Numerous embodiments of and variations on the FIG. 3 single rotary motion approach are disclosed in the incorporated '095 patent. For example, the substrates 60 can be mounted on the drum or cage 34 facing inwardly toward work stations spaced along the internal periphery of the drum.

Figure 4:
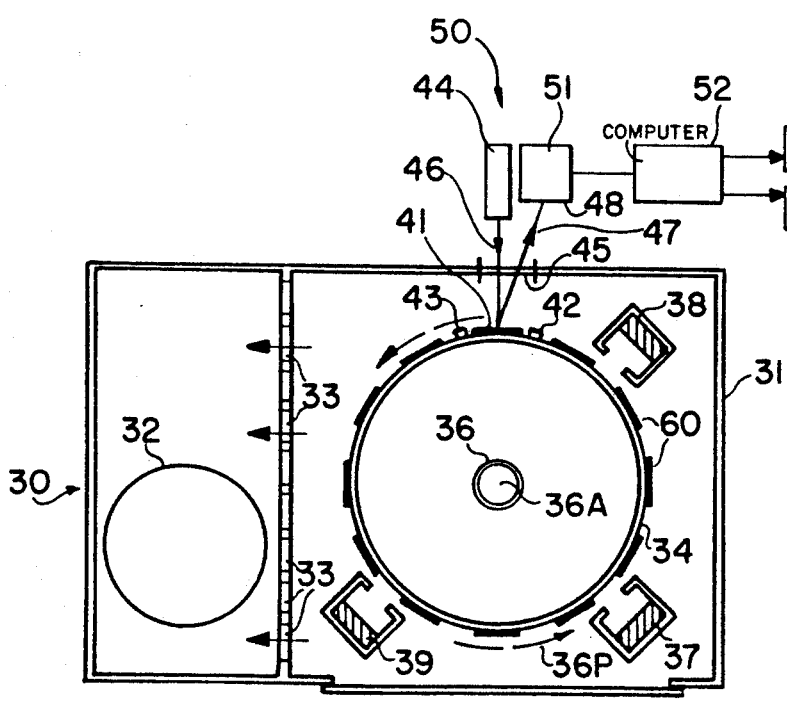
FIG. 4 is a simplified schematic horizontal section view of the system of FIG. 3.

Referring further to FIGS. 3 and 4, in the illustrated preferred apparatus and process embodiment, deposition device 37 is used to deposit material such as silicon whereas device 38 deposits a different material such as aluminum and reaction device 39 is used to chemically react oxygen with the deposited materials to convert the deposited metals to oxide. (Reference numerals 37-39 refer both to the processing stations and to the devices at the stations.) Thus, by rotating the drum 34 and selectively operating the sputtering and reaction stations 37, 38 and 39, layers of the metals, mixtures and alloys thereof and/or oxides of the metals, their mixtures and alloys can be selectively formed on the substrate in essentially any desired combination. In particular, solar cell covers of materials such as aluminum and silicon oxides are formed by rotating drum 34 and simultaneously operating the sputtering targets 37 and 38 and the oxidizer 39. It should be noted that oxidizers such as the one at station location 39 can use a linear magnetron cathode similar to those used at deposition stations 37 and 38, by substituting oxygen for the argon; or can use other ion sources capable of generating a reactive ionized plasma, such as ion guns or the inverse linear magnetron ion source described below, or other devices which generate the required reactive DC or RF plasma.

c. Cantilever Beam Stressometer System

FIGS. 4 and FIG. 5 depict schematically a cantilever beam stressometer system 50 that is incorporated in the vacuum deposition system 30. The stressometer system 50 monitors the stress in a thin film coating such as the cover 68 (see FIG. 6) as it is formed automatically controls the relative amounts of the film constituents which impart tensile and compressive characteristics to the thin film coating, for effecting the desired stress profile across the thickness of the depositing thin film coating. Exemplary materials include silicon, the oxide of which imparts compressive force to coatings, and aluminum, the oxide, of which forms tensile coatings. The system 50 includes a flexible cantilever beam 41 of material such as glass or silicon which is rigidly mounted at its upper end to the drum 34. During the deposition of coatings on the substrates 60, net tensile or compressive force in the depositing coating causes the cantilever beam 41 to deflect radially relative to the drum 34 in opposite directions. A pair of stationary reflector witnesses 42 and 43 are rigidly mounted to the drum near the lower end of, and on opposite sides of, the cantilever beam. A laser 44 is mounted outside the vacuum enclosure 31. The incident laser beam 46 is focused by suitable optics (not shown) through viewing port or sightglass 45 onto the cantilever beam 41 and the witnesses 42 and 43 as the drum rotates so that the reflected laser light 47 is directed onto a grid or target 48. Preferably, the deflection movement of the reflected laser light 47 across the target is converted to an electrical signal containing information regarding the deflection distance by, for example, means such as a photodiode array 51, which applies the signal as input to the computer 52. The computer responsively and selectively alters the power to the silicon target of sputter deposition device 37 and to the aluminum target of sputter deposition device 38 to maintain the stress in the depositing film at a selected constant or varying value.

In the present configuration, the laser beam 47 reflected from the two witnesses 42 and 43 traces across the target or grid 48 a straight line which is intersected by the beam trace. This base line establishes the null point of the laser beam trace, corresponding to zero deflection of the cantilever beam and thus zero net stress on the cantilever beam. Radial deflection of the cantilever beam 41 along path 49, FIG. 5, due to net compressive stress in the depositing film, causes the laser beam to deflect in one direction. Conversely, net tensile stress causes the cantilever beam to deflect radially in the opposite direction, thereby also causing the laser beam to deflect oppositely. To maintain the desired net zero stress level in the coating as it is being formed, the computer 52 controls the power supplied to the targets to adjust the composition of the depositing film. For example, where the film constituents are silicon (compressive) and aluminum (tensile), when the beam deflection indicates net compressive stress, power is increased to the aluminum target to increase the ratio of aluminum in the coating and thus increase the tensile force component in the coating sufficiently to obtain zero net stress. This power increase typically increases the net deposition rate and coating formation rate as well. Alternatively, where the overall deposition rate is or would be too high, power is decreased to the silicon target, decreasing the compressive force component and the coating formation rate. Of course, the stress and deposition rate control can be effected by both increasing power to the aluminum target and decreasing power to the silicon target. Conversely, where the beam deflection indicates tensile stress, power is increased to the silicon target or decreased to the aluminum target or both.

d. Exemplary Covered Solar Cell

FIG. 6 schematically depicts a solar cell 70 having an integral cover 68 formed using our above-described apparatus and process. The covered solar cell 70 comprises silicon substrate 61, obverse side contact layer 62, front side contacts 63 and bus bar 64, AR coating 65, integral thin film cover 68 and AR coating 69. In addition to cover 68, various coatings such as 65 and 69 can be formed using the apparatus 30. Also, as alluded to previously, the coatings can be multi-layer stacks of metals, oxides, mixtures, etc., which serve conductor, filter and other functions. For example, coating 69 can comprise a conductive coating or a conductive AR coating.

EXAMPLE

Integral thick film covers of composition $Al_xSi_yO_z$ were formed on silicon solar cell substrates using the single rotation apparatus depicted in FIGS. 3–5 and the parameters summarized below in TABLE 1. The system used a 28-inch diameter drum rotated at about 60 rpm, a five-inch wide aperture in the isolation baffles, and a five-inch wide target. Silicon and aluminum targets were used in linear magnetron cathode sputter deposition devices 37 and 38 to sputter deposit silicon and aluminum materials simultaneously. A linear magnetron ion source device 39 was operated simultaneously with the deposition devices to oxidize the coating to $Al_xSi_yO_z$ as it was deposited. The cantilever beam 41 was a flat glass leaf, approximately three inches long by 0.008 inches thick by 0.25 inches wide. The cantilever beam stressometer system was operated throughout the combined simultaneous deposition and oxidation process to maintain the coating stress at zero. The process temperature was about 55° C., which is very low, and precludes temperature-caused damage to the solar cell. The resulting solar cell covers were characterized by the sought-after zero net stress, by excellent cover-to-substrate adhesion, and by excellent substrate-to-substrate and run-to-run uniformity (1%). Furthermore, the process is readily scalable by appropriate adjustment of the power and gas flow rates and target height.

TABLE 1

| Substrate: | Silicon solar cells |
|---|---|
| Rotary Motion: | Single |
| Material 1: | Silicon to form AlxSiyOz |
| Material 2: | Aluminum to form AlxSiyOz |
| C.R. 1: | 70 A/s |
| C.R. 2: | 90 A/s |
| Material 1 Gas: | Argon 400 sccm |
| Material 2 Gas: | Argon 400 sccm |
| Material 1 Power: | 2–3.5 KW |
| Material 2 Power: | 2–3.5 KW |
| Argon Sputter Pressure: | 2.5 microns |
| Ion Source Operation | 4 amps; 100–120 sccm $O_2$ |
| Post Operation Bake: | None |

Having thus described preferred and alternative embodiments of our invention, it will be understood that those of usual skill in the art will readily derive extensions and modifications of our invention which are within the scope of the following claims.

We claim:

1. A physical vapor deposition process for forming a coating on a substrate, comprising: simultaneously depositing and oxidizing at least two materials on the substrate to form a thin film coating thereon, said materials being selected from at least one material which imparts compressive force characteristics to the coating and at least one material which imparts tensile force characteristics to the coating; monitoring the stress in the coating during formation thereof; and, responsive to the monitored stress, adjusting the relative deposited amount of said materials as they are being deposited to control the stress in the coating as it is being formed.

2. A process for forming a coating on a substrate, comprising: providing drum means adapted for mounting substrates thereon; rotating the drum means to rotate the substrate past circumferential work stations; using deposition devices adjacent the circumference of the drum, depositing onto the substrates at least a first material which imparts tensile force characteristics to the substrates and at least a second material which imparts compressive force characteristics to the substrates; oxidizing the materials as they are deposited; using a cantilever beam stressometer system which includes a cantilever reflector means mounted on the drum, monitoring the stress levels of the coating in-situ as it is formed; and responsive to the monitoring stress, controlling the amount of compressive and tensile materials as they are being deposited on the substrate to control the stress in the coating.

3. The process of claim 1 or 2, wherein the materials are silicon and aluminum.

4. The process of claim 1 or 2, wherein the substrate is an optical detector.

5. The process of claim 1 or 2, wherein the substrate is a solar cell.

6. Physical vapor deposition apparatus for forming a coating on a substrate, comprising: means for simultaneously depositing at least two materials on the substrate and oxidizing the materials to form a thin film coating thereon, said means comprising at least a first means for depositing a material which imparts compressive force characteristics to the coating and at least a second means for depositing a material which imparts tensile force characteristics to the coating; means for monitoring the stress level in the coating during formation thereof; and means responsive to the monitored stress level for controlling the operation of the deposition means to control the relative amounts of said materials being deposited during the deposition process in response to the stress level measurements during the deposition process and thereby adjust the stress in the coating during the deposition process.

7. The apparatus of claim 6, wherein the first deposition means is adapted for depositing silicon and the second deposition means is adapted for depositing aluminum.

8. The apparatus of claim 6 or 7, wherein the substrate is an optical detector.

9. The process of claim 6 or 7, wherein the substrate is a solar cell.

10. Physical vapor deposition apparatus for forming a coating on a substrate, comprising: drum means adapted for mounting substrates thereon and for rotating the substrates past circumferential work stations; at least a pair of deposition devices positioned adjacent the circumference of the drum, at least a first one of the deposition devices being adapted for depositing on the substrate a material for imparting tensile force characteristics to the coating and at least a second of the devices being adapted for simultaneously depositing on the substrate a material for imparting compressive force characteristics to the coating; at least one reaction device located at the circumference of the drum for oxidizing the materials as they are deposited; cantilever beam stressometer means including a cantilever reflector beam mounted on the drum for monitoring the stress of the depositing film in-situ as it is formed; and means responsive to the monitored stress levels for controlling the amount of compressive and tensile materials as they are being deposited on the substrate to thereby control the coating stress.

11. The apparatus of claim 10, wherein the first deposition means is adapted for depositing silicon and the second deposition means is adapted for depositing aluminum.

12. The apparatus of claim 10 or 11, wherein the substrate is an optical detector.

13. The process of claim 10 or 11, wherein the substrate is a solar cell.

* * * * *